United States Patent [19]

Winnerl et al.

[11] Patent Number: 5,148,250
[45] Date of Patent: Sep. 15, 1992

[54] BIPOLAR TRANSISTOR AS PROTECTIVE ELEMENT FOR INTEGRATED CIRCUITS

[75] Inventors: Josef Winnerl; Xaver Guggenmos, both of Munich, Fed. Rep. of Germany

[73] Assignee: Siemens Aktiengesellschaft, Munich, Fed. Rep. of Germany

[21] Appl. No.: 671,151

[22] Filed: Mar. 18, 1991

Related U.S. Application Data

[63] Continuation of Ser. No. 389,859, Aug. 4, 1989, abandoned.

[30] Foreign Application Priority Data

Aug. 16, 1988 [DE] Fed. Rep. of Germany ....... 3827801

[51] Int. Cl.[5] .................. H01L 29/06; H01L 29/78; H01L 29/68
[52] U.S. Cl. ..................... 357/23.13; 357/23.15; 357/23.8; 357/51; 357/43
[58] Field of Search ............. 357/56, 23.8, 23.13, 357/48, 51, 59, 23.15, 43; 361/91, 56

[56] References Cited

U.S. PATENT DOCUMENTS

| | | | |
|---|---|---|---|
| 3,432,731 | 3/1969 | Whittier | 357/23.8 |
| 3,673,428 | 6/1972 | Athanas | 357/23.13 |
| 4,012,762 | 3/1977 | Abe et al. | 357/23.15 |
| 4,176,372 | 11/1979 | Matsushita et al. | 357/23.15 |
| 4,541,002 | 9/1985 | Shimada | 361/91 |
| 4,605,980 | 8/1986 | Hartranft et al. | 357/23.13 |
| 4,789,917 | 12/1988 | Miller | 357/23.13 |
| 4,996,626 | 2/1991 | Say | 357/23.13 |

FOREIGN PATENT DOCUMENTS

| | | |
|---|---|---|
| 0289431 | 11/1988 | European Pat. Off. . |
| 56-165356 | 12/1981 | Japan ....... 357/23.13 |
| 0165369 | 3/1982 | Japan ....... 357/23.13 |
| 60-53070 | 3/1985 | Japan ....... 361/91 |
| 1253267 | 10/1989 | Japan ....... 357/23.13 |
| 242759 | 2/1990 | Japan ....... 357/23.13 |

OTHER PUBLICATIONS

"A Summary of Most Effective Electrostatic Discharge Protection Circuits for MOS Memories and Their Observed Failure Modes", by C. Duvvury et al., pp. 181–184, EOS/ESD Symp. Proc. 1983, (1983).

"Protection of MOS Integrated Circuits From Destruction By Electrostatic Discharge", by Jack K. Keller, pp. 73–80, EOS/ESD Symp. Proc. 1980, (1980).

Primary Examiner—William Mintel
Assistant Examiner—Mahshid Saadat

[57] ABSTRACT

Bipolar transistor in a protective element for integrated circuits. A bipolar transistor is used as a part of a protective element against electrical high voltages for integrated circuits in their integrated and dismantled condition, this bipolar transistor being insulated from the integrated circuit. A base terminal of the bipolar transistor is connected to a first voltage reference, a collector terminal is connected to a second voltage reference and an emitter terminal is connected to an input or output of the integrated circuit that is to be protected. As a result of the interconnection of the bipolar transistor and as a result of the insulation of the semiconductor substrate, substrate currents that occur during operation are kept as low as possible and the danger of a "latch-up" is thereby suppressed. The protective element may further contain an MOS field effect transistor or a resistive element.

14 Claims, 2 Drawing Sheets

BIPOLAR TRANSISTOR AS PROTECTIVE ELEMENT FOR INTEGRATED CIRCUITS

This is a continuation of application Ser. No. 389,859, filed Aug. 4, 1989, and now abandoned.

BACKGROUND OF THE INVENTION

The present invention is directed to a bipolar transistor used in a protective element for protecting against electrical high voltages for integrated circuits.

Integrated circuits are exposed to electrical high voltages both during operation as well as before integration. MOS transistors are especially sensitive since, due to the low capacitance and due to the high insulating resistance of the MOS gate, a slight charge quantity can produce a high voltage that leads to punch-through of the oxide. For this reason the terminals of the inputs and outputs of the circuit are protected against high voltages by integrated protective structures, particularly in MOS and CMOS circuits.

Integrated protective structures function according to the principle of eliminating electrical high voltages via a low-resistance current path of what is referred to as a clamp element to $V_{DD}$ (supply voltage) or to $V_{SS}$ (ground). Diodes, MOS transistors, parasitic bipolar transistors or other semiconductor components can be used as clamp elements. Two clamp elements having an interposed series resistor are required in the prior art for producing an input protective structure. The series resistor limits the current to the second clamp element and, together therewith, represents a voltage-divider circuit that limits the occurring high voltages to safe values. The clamp elements must have a high-impedance in the operating voltage range and should have a low, differential resistance for high voltages. For example, integrated protective structures and clamp elements are disclosed in the publication by C. Duvvury et al, EOS/ESD Symp. Proc. 1983, page 191 and in the publication of J. K. Keller, EOS/ESD Symp. Proc., 1980, page 73. The components used in the MOS and CMOS protective structures as clamp elements have the disadvantage that diffusion regions are always present in the substrate or in the well that can directly generate substrate currents over the pn-junction or, over a parasitic bipolar transistor. Substrate currents occurring during operation can trigger latch-up in CMOS circuits and therefore represent a considerable safety risk. No protective structures in CMOS technology that avoid this problem are known in the prior art.

For an understanding of the latch up effect, it can be assumed that four successive semiconductor layers of alternating conductivities are generally present between a terminal of a field effect transistor of a first channel type lying in a well-shaped semiconductor zone and a terminal of a field effect transistor of a second channel type located outside of this zone on the semiconductor substrate. One terminal region of the former transistor forms the first semiconductor layer, the well-shaped semiconductor zone forms the second, the semiconductor substrate forms the third and the terminal region of the latter transistor forms the fourth semiconductor layer. A parasitic bipolar pnp transistor and an npn transistor derive as a result of this structure. The collector of the pnp transistor corresponds to the base of the npn transistor and the base of the pnp transistor corresponds to the collector of the npn transistor. This structure forms a four layer pnpn diode as in a thyristor. Given a positive bias on the semiconductor substrate, the pn-junction between the third semiconductor and the fourth semiconductor layer can be biased in a conducting direction to such an extent that a current path arises between the transistor terminals. This current path is attributed to a parasitic thyristor effect within this four-layer structure. This current path can thereby thermically overload the integrated circuit and, moreover, lead to the destruction of the integrated circuit.

SUMMARY OF THE INVENTION

An object of the present invention is to provide an optimally simple protective structure by use of a bipolar transistor as a protective element, whereby the integrated circuit is protected against electrical high voltages at the inputs and outputs and no substrate current triggering "latch-up" is generated.

This object is inventively achieved by a protective element for protecting against electrical high voltages for integrated circuits and having at least a bipolar transistor. The protective element has a doped semiconductor substrate of a first conductivity type. A base terminal of the bipolar transistor is connected to a first voltage reference, a collector terminal of the bipolar transistor is connected to a second voltage reference, and at least one emitter terminal of the bipolar transistor is connected to an input/output of the integrated circuit. The bipolar transistor is insulated from the integrated circuit.

The advantage obtainable with the present invention is that only one semiconductor component is required for realizing an input protective structure, whereby this semiconductor component can be utilized both in MOS or CMOS technology as well as in a combined bipolar/CMOS technology. Likewise, the semiconductor component is also employable in another semiconductor technology and protects the integrated circuit against positive and negative high voltages.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
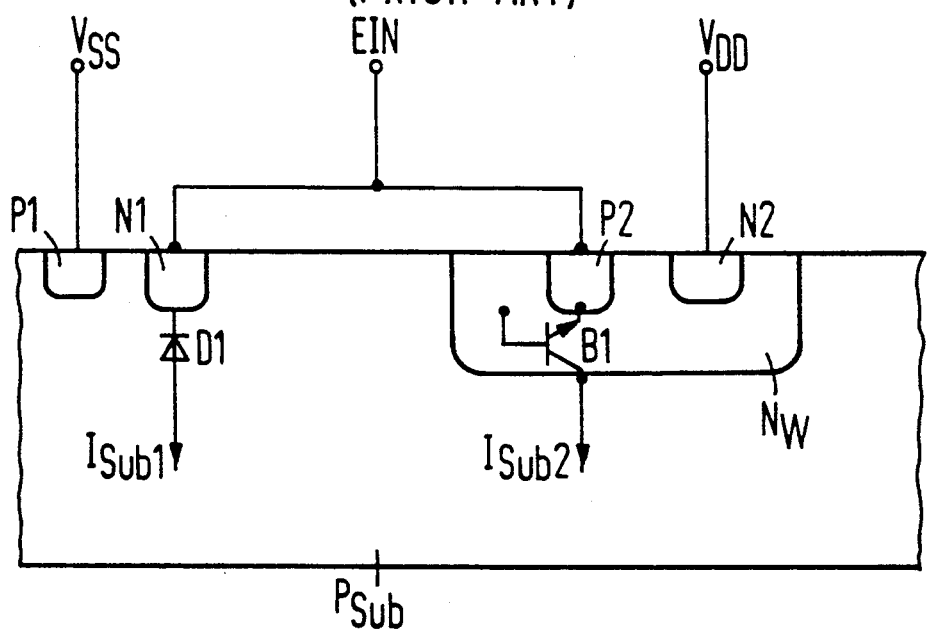
FIG. 1 is a cross-sectional view depicting a clamp element of the prior art.

FIG. 1 shows a clamp element of the prior art composed of a diode D1 and of a bipolar transistor B1. Respectively two such clamp elements in common with a resistor that is connected between the input EIN of a first clamp element and the input of a second clamp element (not shown) to yield an input protective structure. An input line or output line to be protected is parted at a suitable location and the resistor has its two terminals connected into the separated input line or output line. As already initially set forth, the resistor limits the current of the second clamp element and, together therewith, represents a voltage divider circuit that limits the occurring high voltages to safe values. The clamp element is constructed within a p-doped substrate $P_{Sub'}$ whereby a first p+-doped terminal P1 is connected to the ground $V_{SS}$. The diode D1 that is reproduced with its circuit symbol in FIG. 1 for a clearer illustration protects the input line or the output line against negative high voltages. To this end, the cathode side of the diode D1 is realized by a second n+-doped terminal N1 within the p-doped substrate $P_{Sub'}$ whereas the p-doped substrate $P_{Sub}$ is used as the anode terminal of the diode D1.

FIG. 1 further shows an n-conductive, well-shaped semiconductor zone NW within the semiconductor substrate $P_{Sub}$ that is connected to the supply voltage $V_{DD}$ via a third n+-doped terminal N2. In addition to this third terminal N2, the n-conductive, well-shaped semiconductor zone $N_W$ has a fourth p+-doped terminal P2, whereby this latter, fourth terminal P2, together with the n-conductive, well-shaped semiconductor zone $N_W$ in the p-doped semiconductor substrate $P_{Sub'}$ forms a bipolar pnp transistor B1. This bipolar pnp transistor B1 is effective for positive high voltages and dissipates these via the semiconductor substrate $P_{Sub}$. Just like the diode D1, the bipolar pnp transistor B1 is shown with its circuit symbol in FIG. 1 for a clearer illustration. Both elements, the diode D1 as well as the bipolar pnp transistor B1, are connected to a common input EIN of the clamp element at one side, via the second terminal N1 for the diode D1 and via the fourth terminal P2 for the bipolar transistor B1. Both components have the disadvantage that diffusion regions are always present in the semiconductor substrate $P_{Sub}$ or in the well-shaped semiconductor zone $N_W$, these being capable of directly generating substrate currents over the pn-junction or over a parasitic bipolar transistor. Substrate currents occurring during operation, however, can trigger a "latch-up" in CMOS circuits, as previously explained, and therefore represent a great safety risk for the integrated circuit.

Figure 2:
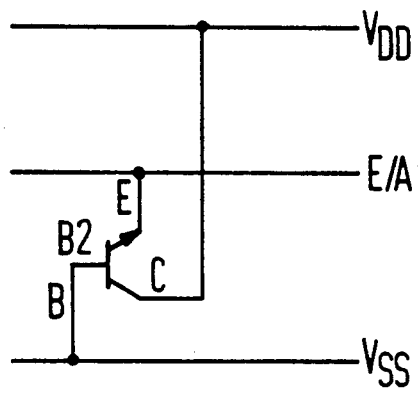
FIGS. 2 and 3 depict in a circuit diagram and a cross-sectional view, respectively, an interconnection and one possible realization of a bipolar transistor as a protective element for integrated circuits.
Figure 3:
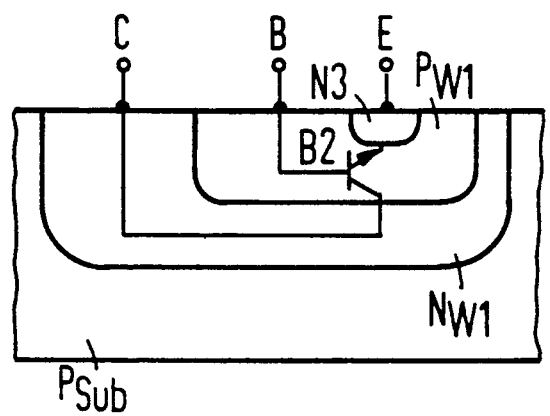

FIG. 2 shows a bipolar transistor B2 inventively connected as a clamp element that, as depicted in the sectional view of FIG. 3, is isolated relative to the p-doped semiconductor substrate $P_{Sub}$. The isolated npn bipolar transistor B2 is interconnected such that the emitter E is connected to the input or output E/A and the base B lies at a reference potential (at $V_{SS}$=ground for npn transistors). The collector C of the npn bipolar transistor B2 is preferably connected to a supply voltage $V_{DD}$, a positive supply voltage in this case. FIG. 3 show how the bipolar npn transistor B2 is inserted within the p-conductive semiconductor substrate $P_{Sub}$. For a better understanding, the bipolar transistor B2 in FIG. 3 is likewise shown as a circuit symbol having a collector terminal C, a base terminal B and an emitter terminal E. A first, well-shaped semiconductor zone $N_{W1}$ that is n-doped and inserted within the p-conductive semiconductor substrate $P_{Sub}$ forms the collector terminal C and, together with the p-doped semiconductor substrate $P_{Sub}$, represents an insulating pn-junction.

A second, well-shaped semiconductor zone $P_{W1}$ is applied within this first well-shaped semiconductor zone $N_W$, this second well-shaped semiconductor zone $P_{W1}$ being p-doped and forming the base terminal B of the bipolar npn transistor B2. Finally, the emitter E is also accommodated within the second well-shaped semiconductor zone $P_{W1}$ by an n+-doped terminal N3.

The function of the bipolar npn transistor B2 utilized as a clamp element shall be set forth below during operation. For pnp bipolar transistors, the polarities of the voltage are to be respectively interchanged. When the voltage at the input or output E/A and, thus, at the emitter E becomes more negative than the reference potential $V_{SS}$, then the bipolar transistor B2 is operated in a forward direction and an emitter current flows as a collector current. The p-doped semiconductor substrate $P_{Sub}$ is thereby electrically insulated by the pn-junction between the n-conductive semiconductor and substrate $P_{Sub}$ and no substrate current can flow. Only if the bipolar npn transistor B2 were to be driven into saturation due to a voltage drop at the collector resistance of the well-shaped semiconductor zone $N_{W1}$ would a substrate current component arise. This can be avoided with a suitable dimensioning of the transistor sizes.

When, by contrast, the voltage at the emitter E of the bipolar npn transistor B2 and, thus, at the input or output E/A of the integrated circuit is more positive than the base potential at the base terminal B and, thus, more positive than the reference voltage $V_{SS}$, then a current can only flow when the emitter/base punch-through voltage is reached. The emitter current thereby occurring flows via the base terminal B, whereby the base itself is insulated from the substrate by the n-conductive, well-shaped semiconductor zone $N_{W1}$. Only when the voltage drop across the base resistance within the p-conductive, well-shaped semiconductor zone $P_{W1}$ becomes greater than the supply of voltage $V_{DD}$ does the parasitic bipolar transistor that is present between the base terminal B, the collector terminal C and the p-doped semiconductor substrate $P_{Sub}$ become conductive resulting in a substrate current. The emitter-base punch-through voltage is usually only slightly higher than the supply voltage $V_{DD}$ and therefore is optimal for the utilization of the protective effect. Due to the incorporation of the bipolar transistor B2, no substrate currents occur as long as the bipolar transistor B2 is not driven into saturation. A "latch-up" is thus avoided given a suitable dimensioning of the transistor sizes. Further, the npn bipolar transistor B2 protects against positive and negative high voltages as a clamp element, whereby the protective effect in both directions begins just outside of the operating voltage range.

Figure 5:
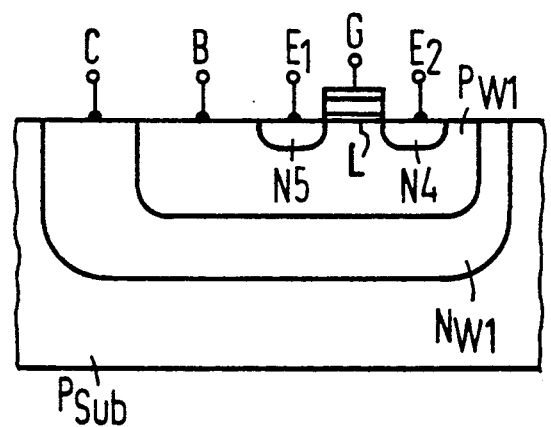
Figure 6:
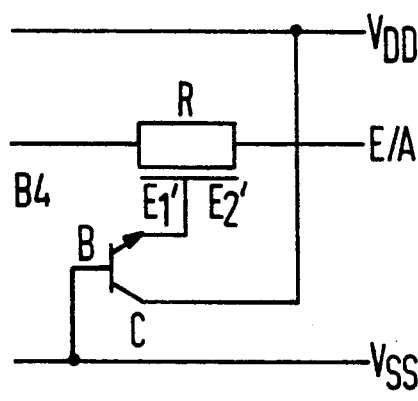
FIGS. 6 and 7 depict in a circuit diagram and a cross-sectional view, respectively, a second modification of the interconnection of the bipolar transistor of FIGS. 2 and 3 having an integrated series resistor.

In the non-integrated or non-connect condition, a single clamp element connected in this fashion protects against positive and negative high voltages with respect both to the positive as well as to the negative supply voltage terminal ($V_{DD}$ or $V_{SS}$), whereby the protective effect respectively begins at voltages that lie only slightly above the voltages allowed during operation. Modifications depicted in FIGS. 4 through 6 are possible for the described clamp element shown in FIG. 2 and FIG. 3, these modifications contain the advantages but have an improved protective effect.

Figure 4:
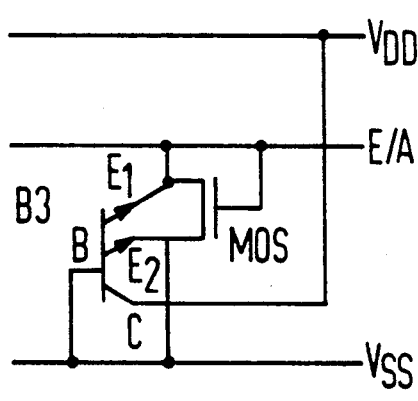
FIGS. 4 and 5 depict in a circuit diagram and a cross-sectional view, respectively, a first modification of the interconnection of a bipolar transistor of FIGS. 2 and 3 having two emitters and a additional MOS transistor.

FIG. 4 shows a first modification of the inventive interconnection of the bipolar transistor. The npn bipolar transistor B3 has two emitters $E_1$ and $E_2$, a base terminal B and a collector terminal C. The interconnection of the npn bipolar transistor B3 with respect to the base terminal B, the collector terminal C and the first emitter terminal $E_1$ is analogous to the interconnection of the npn bipolar transistor B2 of FIG. 2, so that the same reference characters as in FIG. 2 are used here. In addition, however, the npn bipolar transistor B3 is expanded by a second emitter region $E_2$, whereby a MOS transistor MOS arises due to an additional MOS gate between the two emitters $E_1$ and $E_2$. As may be seen from FIG. 4, the second emitter region $E_2$ and the base terminal B are connected to the reference potential $V_{SS}$ (ground) and the gate is connected to the input or output E/A that is to be protected.

When the voltage at the input or output E/A reaches the threshold voltage of the MOS transistor, then the latter becomes conductive and a lateral current flows via the source and drain terminal of the MOS transistor. Gate voltages that lie below the threshold voltage can lead to a punch-through between the two emitters $E_1$ and $E_2$ and thus fulfill the protective function.

When for example, a voltage between E/A and $V_{SS}$ exceeds the threshold voltage $V_T$, then the MOS transistor MOS begins to conduct due to an n-conductive inversion layer between N5 and N4.

The MOS transistor MOS, however, also contains a parasitic npn transistor that is formed by N5, N4 and the p-conductive region between N5 and N4. N5 thereby forms a collector and N4 forms an emitter or vice versa. The "punch-through voltage" is the collector-emitter voltage of this parasitic transistor at which the collector-base space charge zone punches through onto the base-emitter space charge zone, so that the neutral base width becomes equal to zero and the collector current is then only limited by the track resistance.

The element that is relevant for the punch-through is not the MOS transistor but the parasitic npn transistor. The MOS transistor structure is principally used to set the spacing between N5 and N4 and, thus, the "punch-through voltage" (a few volts) in a defined way. The MOS transistor structure can then be dimensioned such that a punch-through occurs below $V_T$, whereby this would even function without gate electrode G. The gate electrode G, however, has a beneficial influence on the punch-through and effects a conductive MOS transistor at voltage above $V_T$.

The realization of the npn bipolar transistor B3 shown in FIG. 5 corresponds largely to that of the bipolar transistor B2 in FIG. 3, so that the same reference characters are again employed here. In contrast to FIG. 3, however, two $n^+$-doped semiconductor terminals N4 and N5 are inserted within the p-conductive, well-shaped semiconductor zone $P_{W1}$, these $n^+$-doped semiconductor terminals N4 and N5 respectively forming the first and second emitter terminal $E_1$ and $E_2$ of the npn bipolar transistor B3. Due to the additional MOS gate G between the emitters $E_1$ and $E_2$, a MOS transistor arises parallel to the lateral bipolar transistor that is situated between the first emitter terminal $E_1$, the base terminal B and the second emitter terminal $E_2$. The gate terminal G may be separated from the two terminals N4 and N5 and from the p-conductive, well-shaped semiconductor zone $P_{W1}$ by a thin insulating layer L. The function of the clamp element from FIG. 4 and FIG. 5 corresponds to that from FIG. 2 and FIG. 3. In case the voltage at the input or output E/A is more positive than the reference potential $V_{SS}$, the occurring base currents produce a voltage drop across the base resistance within the p-doped semiconductor zone P1 that increases the voltage between the first emitter terminal $E_1$ and the base terminal B or the emitter terminal $E_2$. The voltage between the two emitters $E_1$ and $E_2$ rises until an additional punch-through effect occurs between the two emitters $E_1$ and $E_2$. A large part of the current now flows via the second emitter $E_2$ to reference potential $V_{SS}$ (ground). This effect lowers the differential resistance of the clamp element and improves the protective effect. For positive high voltages at the input or output E/A, the MOS field effect transistor B3 via which a current flow due to the high voltage to the reference potential or negative supply voltage $V_{SS}$ is possible. Only the existing bipolar transistor B3 is used for negative high voltages in the interconnection of FIG. 4.

More specifically, when E/A is more positive than $V_{SS}$, then the bipolar transistor B3 (FIG. 4) inhibits. A base-emitter punch-through between B and E1 and a punch-through of the parasitic npn transistor of the MOS transistor structure do not occur abruptly but represent continuous transitions. It becomes clear in a differential consideration that an increase of the voltage between E/A and $V_{SS}$ causes an increase in the current between B and E1 but also causes an increase in the current between E1 and E2 and that, consequently, a higher voltage drop-off arises due to a similar track resistance between N5 and N4, this in turn effecting a higher "punch-through voltage" through the npn transistor of the MOS transistor structure. This mechanism lowers the differential resistance of the post element and allows it to become low-impedance more quickly.

When a negative voltage E/A is applied, then the transistor B3 becomes transmissive as soon as the voltage between B and $E_1$ exceeds approximately 0.7 volts. Since the "punch-through voltage" of the parasitic bipolar transistor of the MOS transistor structure amounts to a few volts, the MOS transistor structure remains ineffective and the functioning corresponds to the functioning of the subject matter of FIG. 2 and FIG. 3.

Figure 7:
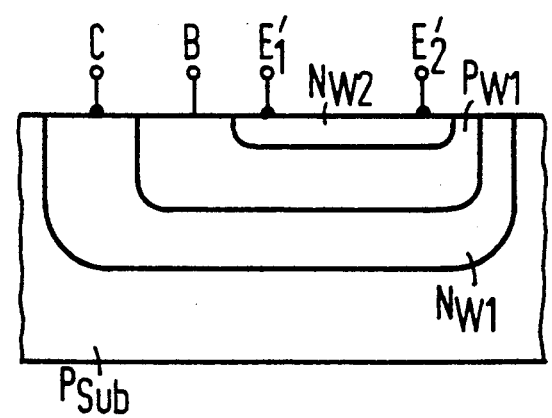

FIG. 6 shows a second modification of the inventive interconnection of a bipolar transistor as a clamp element. As already initially set forth, a resistor is usually integrated in protective structures for current-limitation. This transistor is realized either by a polysilicon track or by a diffusion track. Polysilicon tracks have the advantage of being electrically insulated (no substrate current is possible), but cannot be loaded to as high a degree due to the thermic insulation. Diffusion resistors in conventional CMOS technology, by contrast, generate a lower substrate current. According to FIG. 6, the base terminal B of the npn bipolar transistor B4 is connected to the reference potential $V_{SS}$ (ground) and the collector terminal of the same transistor is connected to the supply voltage $V_{DD}$, whereas two emitter terminals $E_{1'}$ and $E_{2'}$ are provided instead of one emitter as in FIG. 2. The drive-in resistor R is located according to FIG. 6 such that it is situated between the two emitter terminals $E_{1'}$ and $E_{2'}$. Further, the resistor R is connected to the input line or output line E/A that is to be protected. The entire arrangement satisfies a protective function of a type that can be achieved in the traditional prior art with two clamp elements and an interposed resistor R. This may be clearly seen in the illustration of FIG. 7. This shows the structure of the npn bipolar transistor B4 with the integrated resistor R. A well-shaped, n-conductive semi-conductor zone $N_{W1}$ that forms the collector terminal C is inserted within the p-doped semiconductor substrate $P_{Sub}$. A second p-conductive semiconductor zone $P_{W_1}$ is accommodated within this n-conductive semiconductor zone $N_{W_1}$ and serves as the base terminal B for the npn bipolar transistor B4. A further well-shaped semiconductor zone $N_{W_2}$ is in turn accommodated within the latter, this being n+-doped and having a respective emitter terminal $E_{1'}$ and $E_{2'}$ at opposed ends. As already depicted in FIG. 6, the npn bipolar transistor B4 with the resistor R fulfills the function of a protective structure having two clamp elements and a diffused track resistor. The first clamp element is thereby formed by the semiconductor structure between the first emitter $E_{1'}$, the base terminal B and the collector terminal C and the second element is formed by the semiconductor structure between the second emitter $E_{2'}$, the base terminal B and the collector terminal C, whereas the diffused track resistor is present between the first and second emitter terminal $E_{1'}$, $E_{2'}$.

The present invention is employable for all bipolar/CMOS technologies having insulated bipolar transistors regardless of the well type (n-well or p-well; npn or pnp transistor) and regardless of the type of bipolar transistor (for example, an implanted bipolar transistor or a poly-emitter bipolar transistor).

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A protective element for protecting an integrated circuit from excessive voltages wherein said integrated circuit is formed in a substrate of a first conductivity type and includes an input/output line, the protective element comprising:
    a MOS field effect transistor having a gate and source and drain zones, one of said source and drain zones being coupled to a first reference voltage, and said gate and the other of said source and drain zones being coupled to said input/output line such that said MOS field effect transistor rapidly activates upon the presence of a preselected excessive voltage on said input/output line to shunt said excessive voltage to said first reference voltage; and
    a parasitic bipolar transistor formed in said substrate with said MOS field effect transistor and having a collector, a base, and first and second emitter zones, said source and drain zones of said MOS field effect transistor being said first and second emitter zones, said base and said first emitter zone being coupled to said first reference voltage, said collector being coupled to a second reference voltage, and said second emitter zone being coupled to said input/output line such that no substrate current triggering "latch-up" is generated.

2. The protective element according to claim 1, wherein a first well-shaped semiconductor zone of a second conductivity type is located in the doped semiconductor substrate of a first conductivity type, the first well-shaped semiconductor zone being the collector terminal of the bipolar transistor and the first well-shaped semiconductor zone of a second conductivity type forming an insulation between the bipolar transistor and the integrated circuit; wherein a second well-shaped semiconductor zone of a first conductivity type is inserted in the first well-shaped semiconductor zone of a second conductivity type, the second well-shaped semiconductor zone being the base terminal of the bipolar transistor; and wherein the first and second emitter zones are of a more highly doped, second conductivity type and are inserted in the second well-shaped semiconductor zone of a first conductivity type; wherein the gate terminal of the MOS field effect transistor is applied above and between the first and second emitter zones; and wherein the gate terminal is separated from the first second emitter zones and from the second well-shaped semiconductor zone of a first conductivity type by a thin insulating layer.

3. The protective element according to claim 2, wherein the bipolar transistor is an npn bipolar transistor and the MOS field effect transistor is an n-channel field effect transistor; wherein the second well-shaped semiconductor zone and the semiconductor substrate of a first conductivity type are p-doped and the first and third well-shaped semiconductor zones and the emitter zones of a second conductivity type are n-doped; and wherein the first voltage reference is lower than the second voltage reference.

4. The protective element according to claim 2, wherein the bipolar transistor is a pnp bipolar transistor and the MOS field effect transistor is a p-channel MOS field effect transistor; wherein the semiconductor substrate and the second well-shaped semiconductor zone of a first conductivity type are n-doped and the first and third well-shaped semiconductor zones and the emitter zones of a second conductivity type are p-doped; and wherein the first voltage reference is higher than the second voltage reference.

5. A protective element for protecting an integrated circuit from excessive voltages wherein said integrated circuit is formed in a substrate of a first conductivity type and includes an input/output line, the protective element comprising:
    a bipolar transistor formed in said substrate and having a collector, a base, and an elongated emitter zone with first and second ends, said base being coupled to a first reference voltage, said collector being coupled to a second reference voltage; and
    a diffused resistor in said substrate, said diffused resistor having first and second ends, said diffused resistor being said elongated emitter zone and said first and second ends of said diffused resistor being said first and second ends, respectively, of said elongated emitter zone, said resistor being coupled in series in said input/output line so that said bipolar transistor shunts voltages above a preselected threshold on said input/output line to said first reference voltage.

6. The protective element according to claim 5, wherein a first well-shaped semiconductor zone of a second conductivity type is located in the doped semiconductor substrate of a first conductivity type, the first well-shaped semiconductor zone being the collector terminal of the bipolar transistor and the first well-shaped semiconductor zone of a second conductivity type forming an insulation between the bipolar transistor and the integrated circuit; wherein a second well-shaped semiconductor zone of a first conductivity type, is inserted in the first well-shaped semiconductor zone of a second conductivity type, the second well-shaped semiconductor zone being the base of the bipolar transistor; and wherein a third well-shaped semiconductor zone of a more highly doped, second conductivity type is inserted in the second well-shaped semiconductor zone of a first conductivity type; and wherein the third well-shaped semiconductor zone is the diffused resistor element.

7. The protective element according to claim 6, wherein the bipolar transistor is an npn bipolar transistor; wherein the second well-shaped semiconductor zone and the semiconductor substrate of a first conductivity type are p-doped and the first and third well-shaped semiconductor zones of a second conductivity type are n-doped; and wherein the first voltage reference is lower than the second voltage reference.

8. The protective element according to claim 6, wherein the bipolar transistor is a pnp bipolar transistor; wherein the semiconductor substrate and the second well-shaped semiconductor zone of a first conductivity type are n-doped and the first and third well-shaped semiconductor zones of a second conductivity type are p-doped; and wherein the first voltage reference is higher than the second voltage reference.

9. A protective element for protecting an integrated circuit in a doped semiconductor substrate of a first conductivity type from electrical high voltages comprising:
a bipolar transistor comprising a base terminal connected to a first voltage reference, a collector terminal connected to a second voltage reference and at least one emitter zone connected to an input/output of the integrated circuit and the bipolar transistor being insulated from the integrated circuit and the bipolar transistor containing first and second emitter terminals; and
a MOS field effect transistor having a gate terminal located between the first and second emitter terminals, the gate terminal of the MOS field effect transistor and the first emitter terminal each being connected to the input/output of the integrated circuit and the second emitter terminal being connected to the first voltage reference; a first well-shaped semiconductor zone of a second conductivity type located in the doped semiconductor substrate of a first conductivity type, the first well-shaped semiconductor zone being the collector terminal of the bipolar transistor and the first well-shaped semiconductor zone of a second conductivity type forming an insulation between the bipolar transistor and the integrated circuit; a second well-shaped semiconductor zone of a first conductivity type being inserted in the first well-shaped semiconductor zone of a second conductivity type, the second well-shaped semiconductor zone being the base terminal of the bipolar transistor; and first and second emitter zones of a more highly doped, second conductivity type inserted in the second well-shaped semiconductor zone of a first conductivity type, the first and second emitter zones being the first and second emitter terminals, respectively, of the bipolar transistor; the gate terminal of the MOS field effect transistor applied above and between the first and second emitter zones; and the gate terminal separated from the first and second emitter zones and from the second well-shaped semiconductor zone of a first conductivity type by a thin insulating layer.

10. The protective element according to claim 9, wherein the bipolar transistor is an npn bipolar transistor and the MOS field effect transistor is an n-channel field effect transistor; wherein the second well-shaped semiconductor zone and the semiconductor substrate of a first conductivity type are p-doped and the first and third well-shaped semiconductor zones and the emitter zones of a second conductivity type are n-doped; and wherein the first voltage reference is lower than the second voltage reference.

11. The protective element according to claim 9, wherein the bipolar transistor is a pnp bipolar transistor and the MOS field effect transistor is a p-channel MOS field effect transistor; wherein the semiconductor substrate and the second well-shaped semiconductor zone of a first conductivity type are n-doped and the first and third well-shaped semiconductor zones and the emitter zones of a second conductivity type are p-doped; and wherein the first voltage reference is higher than the second voltage reference.

12. A protective element for protecting an integrated circuit against electrical high voltages comprising a parasitic bipolar transistor, the protective element having a doped semiconductor substrate of a first conductivity type, a base terminal of the parasitic bipolar transistor connected to a first voltage reference, a collector terminal of the parasitic bipolar transistor connected to a second voltage reference and at least one emitter terminal of the parasitic bipolar transistor connected to an input/output of the integrated circuit; the parasitic bipolar transistor being insulated from the integrated circuit; a diffused resistor element having first and second ends forming first and second emitter terminals, respectively, of the parasitic bipolar transistor; the resistor element having its first and second emitter terminals connected between the input/output of the integrated circuit; a first well-shaped semiconductor zone of a second conductivity type located in the doped semiconductor substrate of a first conductivity type, the first well-shaped semiconductor zone being the collector terminal of the parasitic bipolar transistor and the first well-shaped semiconductor zone of a second conductivity type forming an insulation between the parasitic bipolar transistor and the integrated circuit; a second well-shaped semiconductor zone of a first conductivity type inserted in the first well-shaped semiconductor zone of a second conductivity type, the second well-shaped semiconductor zone being the base terminal of the parasitic bipolar transistor; and a third well-shaped semiconductor zone of a more highly doped, second conductivity type inserted in the second well-shaped semiconductor zone of a first conductivity type, the third well-shaped semiconductor zone being the resistor element.

13. The protective element according to claim 12, wherein the parasitic bipolar transistor is an npn bipolar transistor; wherein the second well-shaped semiconductor zone and the semiconductor substrate of a first conductivity type are p-doped and the first and third well-shaped semiconductor zones of a second conductivity type are n-doped; and wherein the first voltage reference is lower than the second voltage reference.

14. The protective element according to claim 12, wherein the parasitic bipolar transistor is a pnp bipolar transistor; wherein the semiconductor substrate and the second well-shaped semiconductor zone of a first conductivity type are n-doped and the first and third well-shaped semiconductor zones of a second conductivity type are p-doped; and wherein the first voltage reference is higher than the second voltage reference.

* * * * *